US011430738B2

(12) United States Patent
Wu et al.

(10) Patent No.: US 11,430,738 B2
(45) Date of Patent: Aug. 30, 2022

(54) LIGHT-EMITTING DIODE DISPLAY AND METHOD FOR PRODUCING THE SAME

(71) Applicant: PRILIT OPTRONICS, INC., Tainan (TW)

(72) Inventors: Biing-Seng Wu, Tainan (TW); Chao-Wen Wu, Tainan (TW)

(73) Assignee: PRILIT OPTRONICS, INC., Tainan (TW)

( * ) Notice: Subject to any disclaimer, the term of this patent is extended or adjusted under 35 U.S.C. 154(b) by 92 days.

(21) Appl. No.: 16/231,714

(22) Filed: Dec. 24, 2018

(65) Prior Publication Data

US 2020/0203420 A1  Jun. 25, 2020

(51) Int. Cl.

| | |
|---|---|
| *H01L 23/538* | (2006.01) |
| *H01L 33/62* | (2010.01) |
| *G09G 3/32* | (2016.01) |
| *H01L 25/16* | (2006.01) |
| *H01L 23/64* | (2006.01) |
| *H01L 23/552* | (2006.01) |
| *H01L 23/60* | (2006.01) |
| *H01L 25/075* | (2006.01) |
| *H01L 25/00* | (2006.01) |
| *H05K 1/02* | (2006.01) |
| *G03F 7/00* | (2006.01) |
| *H01L 23/31* | (2006.01) |
| *H01L 33/52* | (2010.01) |
| *H01L 23/48* | (2006.01) |

(52) U.S. Cl.
CPC .......... *H01L 23/5389* (2013.01); *G09G 3/32* (2013.01); *H01L 23/5386* (2013.01); *H01L 23/552* (2013.01); *H01L 23/60* (2013.01); *H01L 23/647* (2013.01); *H01L 25/0753* (2013.01); *H01L 25/167* (2013.01); *H01L 25/50* (2013.01); *H01L 33/62* (2013.01); *H05K 1/026* (2013.01); *G03F 7/0007* (2013.01); *G09G 2300/0408* (2013.01); *G09G 2300/0413* (2013.01); *G09G 2330/04* (2013.01); *G09G 2330/10* (2013.01); *H01L 23/3121* (2013.01); *H01L 23/481* (2013.01); *H01L 33/52* (2013.01); *H01L 2933/0066* (2013.01)

(58) Field of Classification Search
None
See application file for complete search history.

(56) References Cited

U.S. PATENT DOCUMENTS

| | | | | |
|---|---|---|---|---|
| 9,367,094 | B2* | 6/2016 | Bibl | .............. H01L 23/3171 |
| 9,582,036 | B2* | 2/2017 | Bibl | .............. H01L 23/5384 |
| 2015/0169011 | A1* | 6/2015 | Bibl | .............. H01L 31/0216 |
| | | | | 345/175 |

(Continued)

*Primary Examiner* — Abul Kalam
(74) *Attorney, Agent, or Firm* — Muncy, Geissler, Olds & Lowe, P.C.

(57) ABSTRACT

A light-emitting diode display is provided. The light-emitting diode display includes a substrate, a plurality of wires, a plurality of light-emitting areas, and at least one driver IC. The plurality of wires are formed on the substrate. The plurality of light-emitting areas include a light-emitting diode area and a virtual area. The plurality of light-emitting areas are arranged in a matrix. The virtual area of the plurality of light-emitting areas corresponds to each other. The driver IC is formed on the virtual area of the plurality of the light-emitting areas or on the plurality of the light-emitting areas.

30 Claims, 9 Drawing Sheets

(56) References Cited

U.S. PATENT DOCUMENTS

| | | | |
|---|---|---|---|
| 2016/0259368 A1* | 9/2016 | Bibl | H01L 23/3171 |
| 2017/0125392 A1* | 5/2017 | Bibl | H01L 25/165 |
| 2020/0035750 A1* | 1/2020 | Li | H01L 25/167 |

* cited by examiner

LIGHT-EMITTING DIODE DISPLAY AND METHOD FOR PRODUCING THE SAME

BACKGROUND OF THE INVENTION

1. Field of the Invention

The present disclosure relates to a light-emitting diode display and a method for producing the same, more specifically to a light-emitting diode display and a method for producing the same that enable a driver IC to correspondingly be formed on a plurality of light-emitting areas.

2. Description of the Related Art

As portable devices become smaller and smaller, there is not much room for relevant elements of the display device. Therefore, how to make the configuration of the relevant elements more tightly has become a critical issue that needs to be addressed.

SUMMARY OF THE INVENTION

In view of the aforementioned problem in prior art, one of the purposes of the present disclosure is to provide a light-emitting diode display in order to make the configuration of the relevant elements more tightly.

Hence, to achieve the purpose mentioned above, the present disclosure provides a light-emitting diode display, including: a substrate, a plurality of wires, a plurality of light-emitting areas, and at least one driver IC. The plurality of wires are formed on the substrate. The plurality of light-emitting areas include a light-emitting diode area and a virtual area. The plurality of light-emitting areas are arranged on the plurality of wires in a matrix. The virtual area or the light-emitting diode area of plurality of light-emitting areas correspond to each other. A driver IC is disposed on the virtual area of the plurality of light-emitting areas corresponding to each other. The driver IC may also be formed on the plurality of light-emitting areas. In this case, the virtual area of the plurality of light-emitting areas is unnecessarily disposed correspondingly to each other.

Preferably, when at least one light-emitting diode of the light-emitting diode area is damaged, at least one light-emitting diode with normal function may be formed in the virtual area.

Preferably, a plurality of light-emitting areas may be small molecular organic light guiding layers or large molecular organic light guiding layers.

Preferably, a photosensitive resin black matrix may be formed between the plurality of light-emitting areas.

Preferably, a first metal layer may be formed on the plurality of light-emitting areas, and a flat layer may be formed on the first metal layer.

Preferably, a second metal layer may be formed on the flat layer, and the driver IC mat be disposed on the second metal layer and corresponds to the photosensitive resin black matrix and the virtual area.

Preferably, a protective layer is further included, which is formed on the second metal layer, the flat layer, and the driver IC.

Preferably, the flat layer may be a light guiding material having a refractive index greater than 1, and the protective layer may be an opaque organic material.

Preferably, the light-emitting diode area may include a plurality of micro light-emitting diodes.

Preferably, the plurality of micro light-emitting diodes may be flip-chip types or vertical types.

Preferably, the plurality of wires, the first metal layer, and the second metal layer may increase thicknesses by an electroplating process, thus reducing impedance.

Preferably, the first metal layer may include a plurality of metal wires, and the plurality of wires are connected electrically through a shorting bar.

Preferably, the plurality of wires may electrically be connected to each other through an impedance line.

Preferably, a plurality of spiky metal blocks may be disposed beside the plurality of wires.

In addition, the present disclosure provides a method for producing a light-emitting diode display, including a substrate formed on a plurality of wires. The plurality of light-emitting areas are arranged on the plurality of wires in a matrix. The plurality of light-emitting areas include a light-emitting diode area, a virtual area, and a driver IC correspondingly formed on the plurality of light-emitting areas. The driver IC may also be formed on the plurality of light-emitting areas. In this case, the virtual area of the plurality of light-emitting areas is unnecessarily disposed correspondingly to each other.

Preferably, when at least one light-emitting diode of the light-emitting diode area is damaged, at least one light-emitting diode with normal function may be formed in the virtual area.

Preferably, a plurality of light-emitting areas may be small molecular organic light guiding layers or large molecular organic light guiding layers.

Preferably, a photosensitive resin black matrix may be formed between the plurality of light-emitting areas.

Preferably, a first metal layer may be formed on the plurality of light-emitting areas, and a flat layer may be formed on the first metal layer.

Preferably, the second metal layer may be formed on the flat layer and the driver IC may be formed on the second metal layer and correspond to the photosensitive resin black matrix and of the virtual area.

Preferably, a protective layer may further be formed on the second metal layer, the flat layer, and the driver IC.

Preferably, the protective layer may be an opaque organic material.

Preferably, the flat layer may be a transparent organic material.

Preferably, the light-emitting diode area may include a plurality of micro light-emitting diodes.

Preferably, the plurality of micro light-emitting diodes may be flip-chip types or vertical types.

Preferably, the plurality of wires, the first metal layer, and the second metal layer may increase thicknesses by an electroplating process, thus reducing the impedance.

Preferably, the first metal layer includes the plurality of wires, and the plurality of wires may electrically be connected through a shorting bar.

Preferably, the plurality of wires may electrically be connected to each other through an impedance line.

Preferably, a plurality of spiky metal blocks may be disposed beside the plurality of wires.

As mentioned above, the present disclosure has one or more of the following advantages:

1. Through disposing the virtual area, the driver IC is able to correspondingly be formed on the light-emitting areas.

2. With the improvement of materials and soldering technique, the driver IC may be disposed on the flat layer and the photosensitive resin black matrix.

3. Because the driver IC is able to correspondingly be formed on the virtual area and the photosensitive resin black matrix, the plurality of light-emitting areas may be close to each other more tightly, thus shortening the distance between the pixels.

4. Because the driver IC is able to be disposed on the light-emitting areas, the relative position of the plurality of light-emitting areas and the driver IC may be arranged randomly so as to further shorten the distance between the pixels.

Part 4B depicts a schematic diagram of another electrostatic protection in the present disclosure.

Figure 4A:
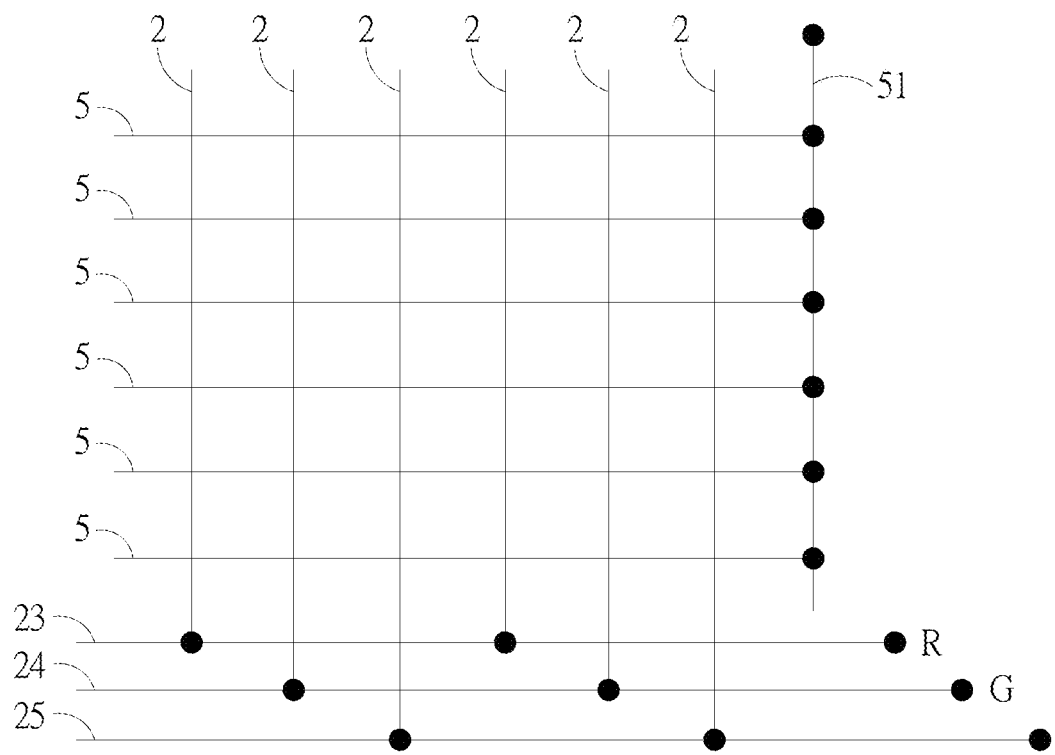
FIG. 4A depicts a schematic diagram of the electrostatic protection in the present disclosure.
Figure 4B:
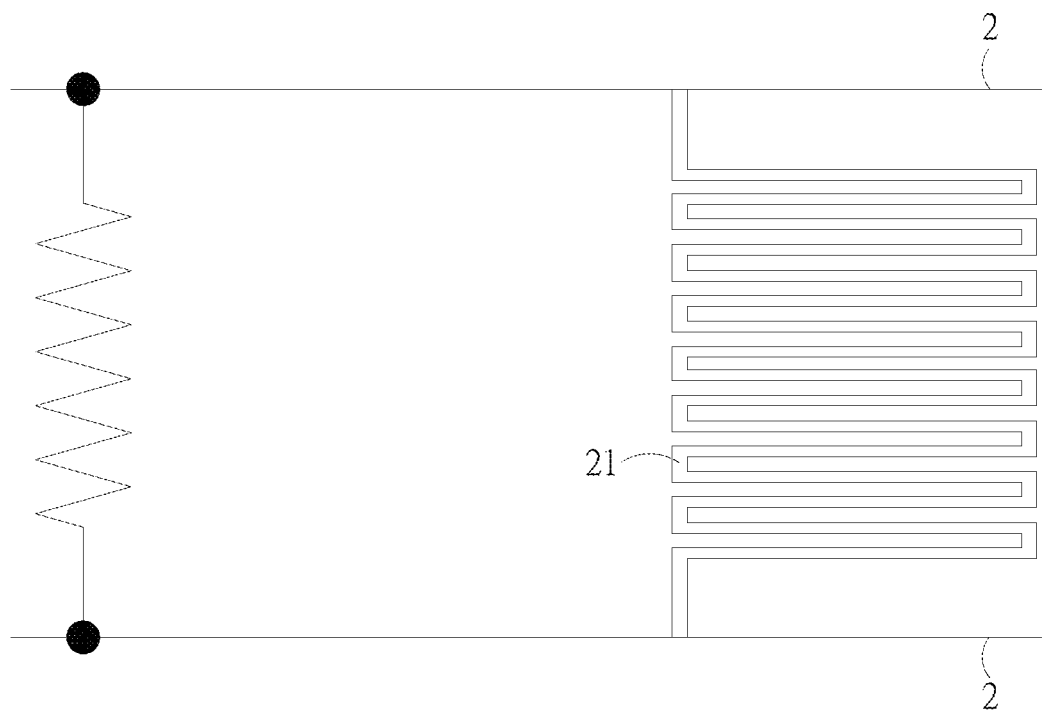
Figure 4C:
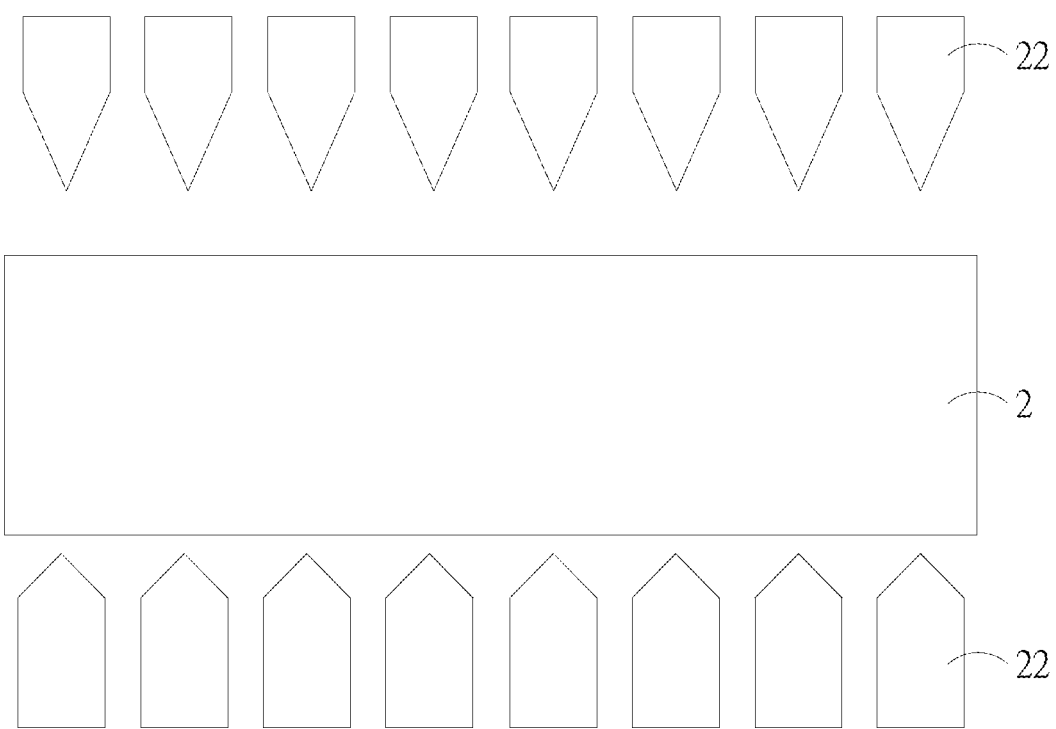

FIG. 4C depicts a schematic diagram of another electrostatic protection in the present disclosure.

DESCRIPTION OF THE PREFERRED EMBODIMENTS

To facilitate the review of the technique features, contents, advantages, and achievable effects of the present disclosure, the embodiments together with the attached drawings are described below in detail. However, the drawings are used for the purpose of indicating and supporting the specification, which may not depict the real proportion of elements and precise configuration in the implementation of the present disclosure. Therefore, the depicted proportion and configuration of the attached drawings should not be interpreted to limit the scope of implementation of the present disclosure.

The present disclosure describes one or more embodiments that disclose a light-emitting diode display. The light-emitting diode display disclosed by the following embodiments can have the effect of enabling the elements of the display to be configured more closely.

Figure 1:
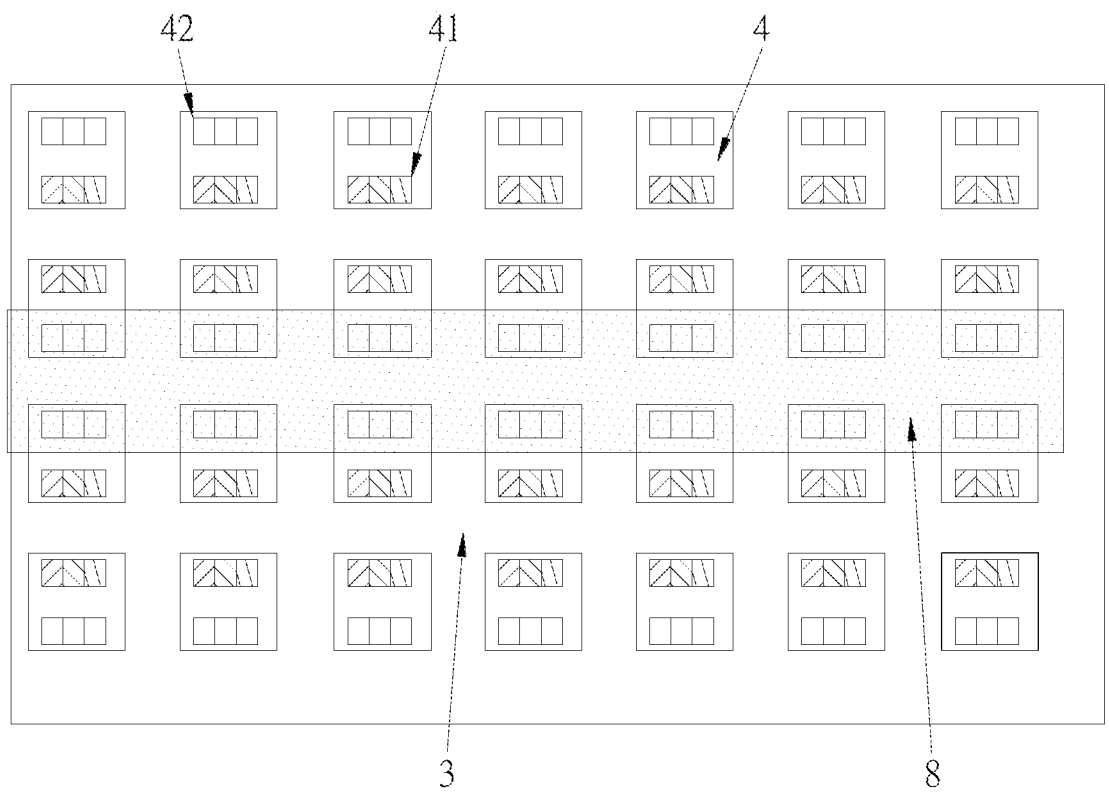
FIG. 1 depicts an inner-top diagram of the light-emitting diode display according to an embodiment of the present disclosure.
Figure 2A:
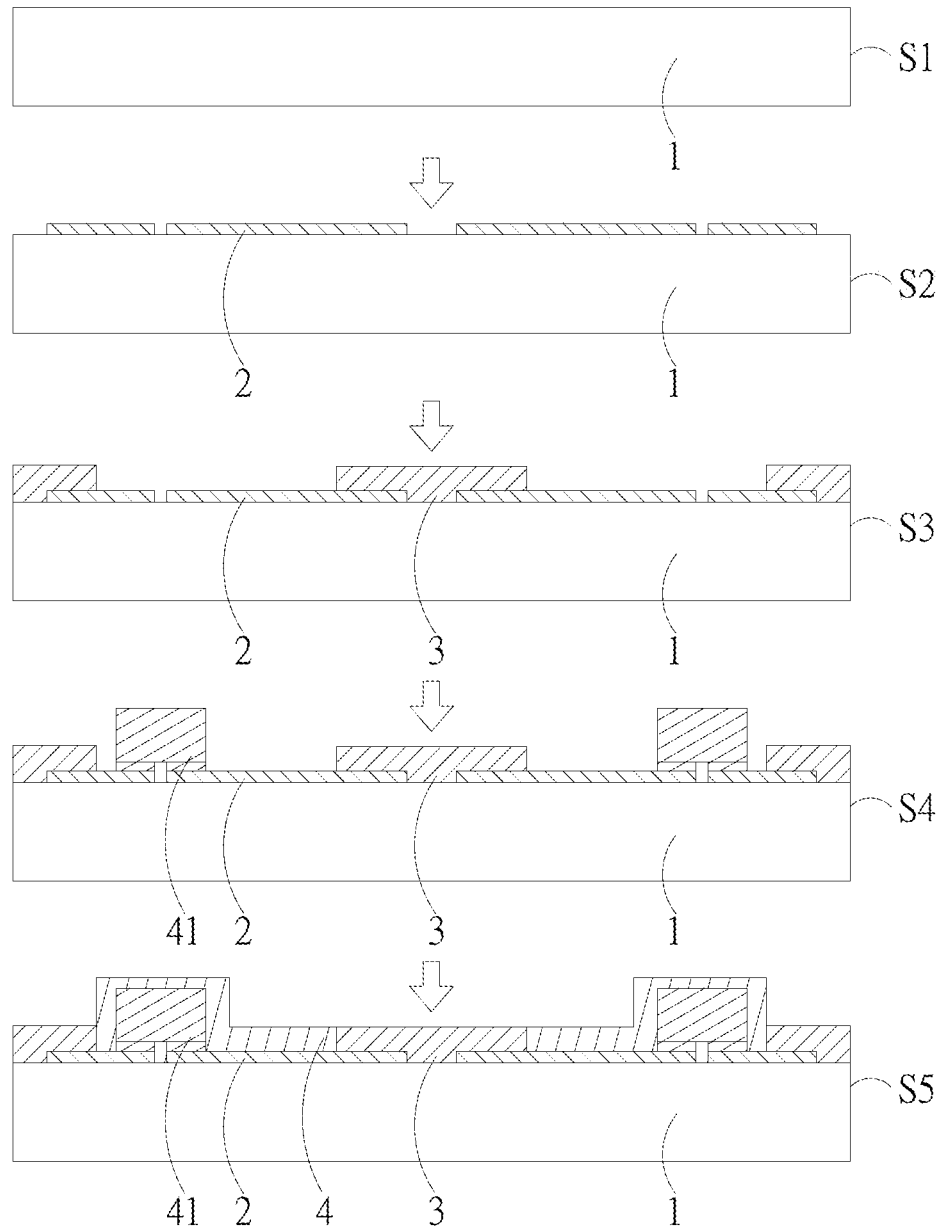
FIG. 2A depicts a flow chart for production of the light-emitting diode display according to an embodiment (flip-chip micro light-emitting diode) of the present disclosure.
Figure 2B:
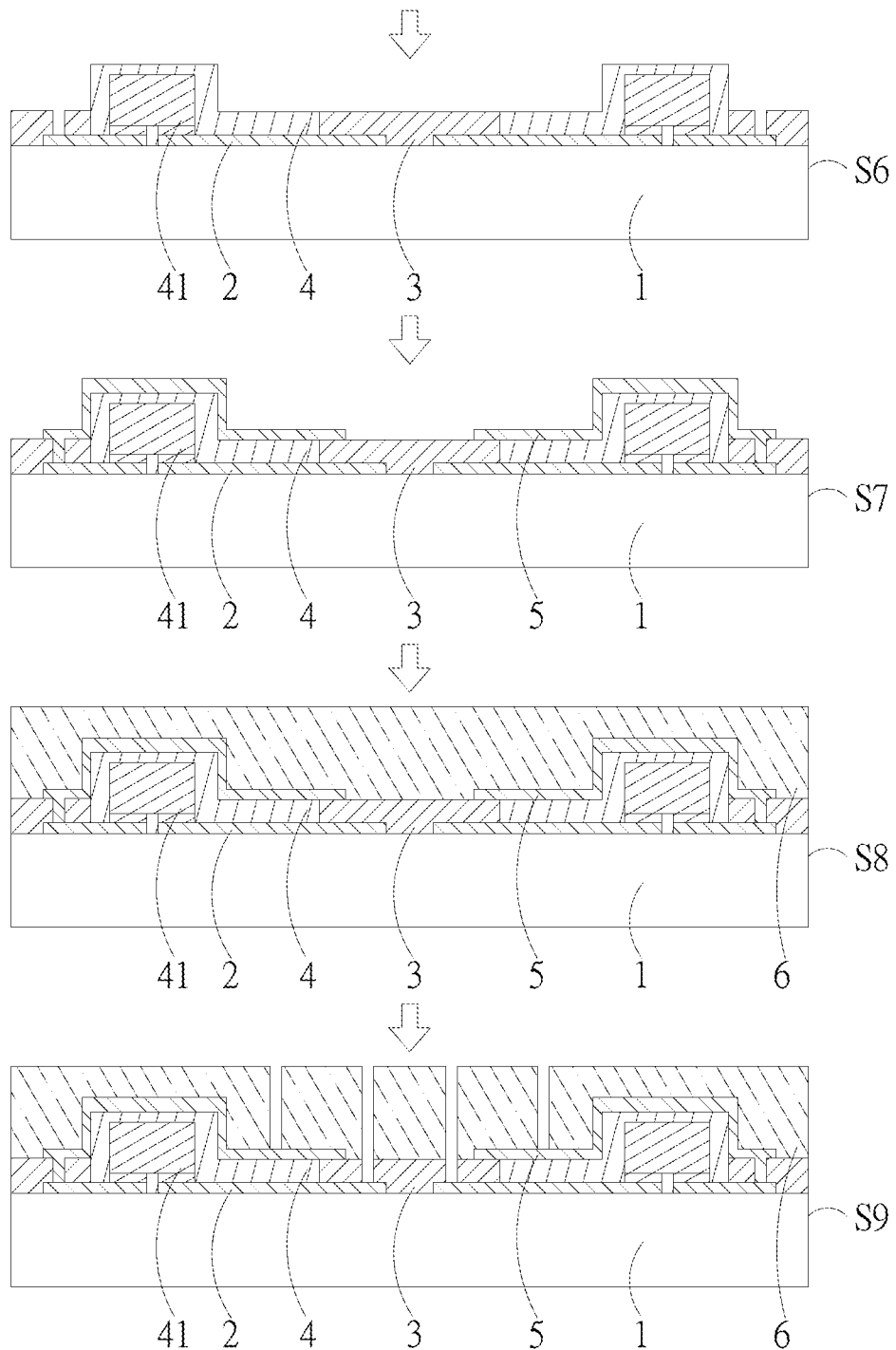
FIG. 2B depicts a flow chart for production of the light-emitting diode display according to an embodiment (flip-chip micro light-emitting diode) of the present disclosure.
Figure 2C:
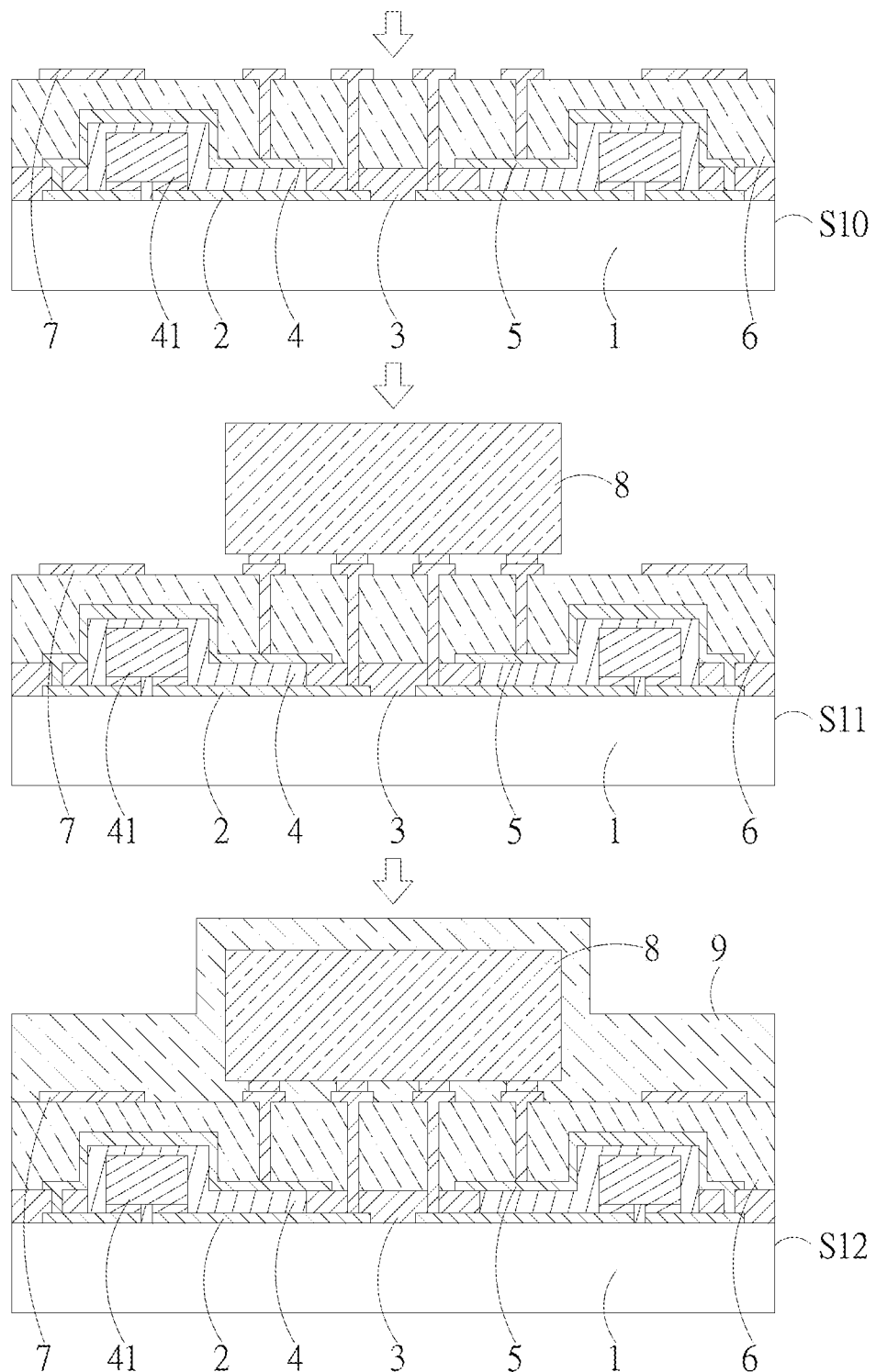
FIG. 2C depicts a flow chart for production of the light-emitting diode display according to an embodiment (flip-chip micro light-emitting diode) of the present disclosure.

Please refer to FIG. 1 to FIG. 2C. FIG. 1 depicts the inner-top diagram of the light-emitting diode display according to an embodiment of the present disclosure. FIG. 2A to FIG. 2C are flow charts for production of the light-emitting diode display according to an embodiment (flip-chip micro light-emitting diode) of the present disclosure.

Figure 3A:
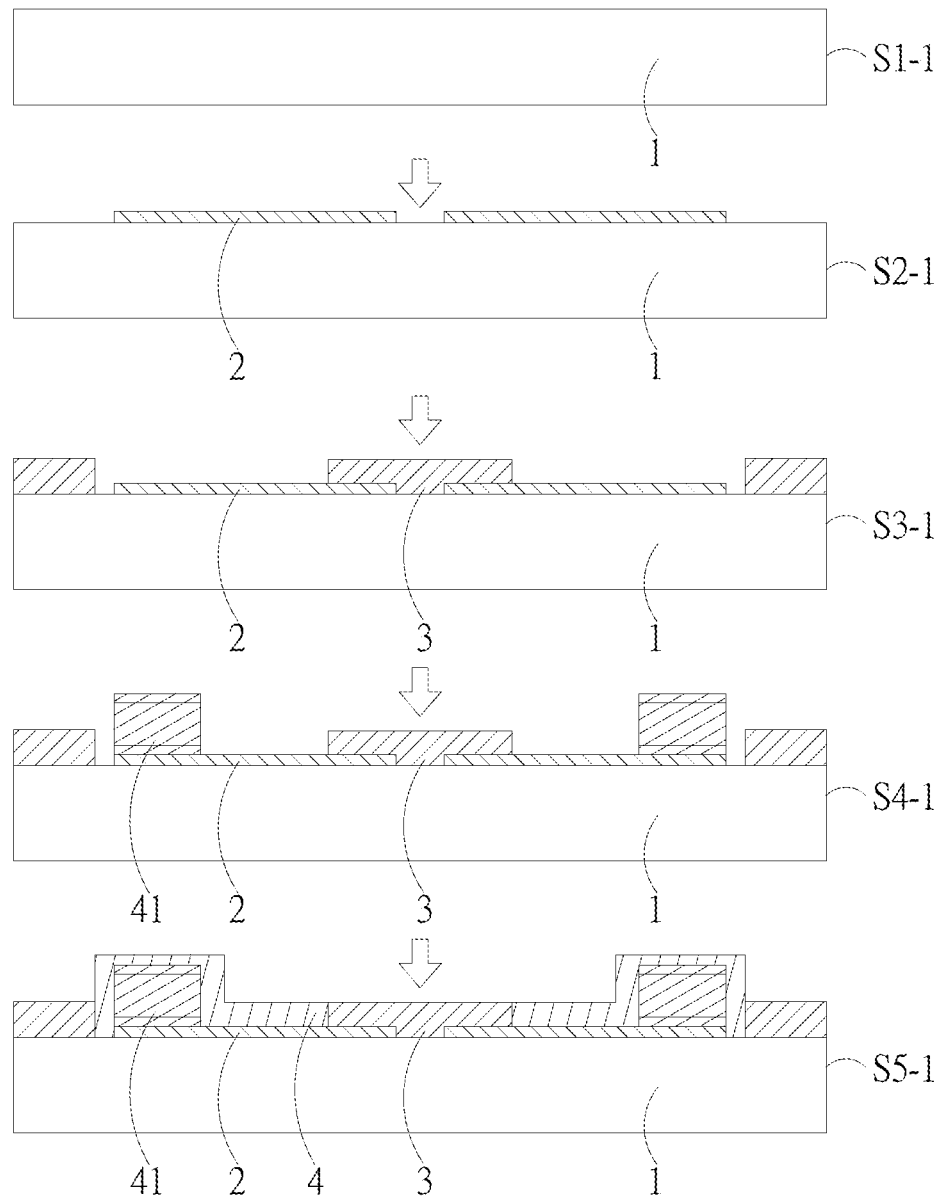
FIG. 3A depicts a flow chart for production of the light-emitting diode display according to another embodiment (vertical micro light-emitting diode) of the present disclosure.

As shown in FIG. 1 to FIG. 2C, the light-emitting diode display in the present disclosure includes: a substrate 1, a plurality of wires 2, a plurality of light-emitting areas 4, and at least one driver IC 8. Substrate 1 is selected from one of the following substrates: a transplant glass substrate or a plastic substrate. The plurality of wires 2 are arranged and formed on the substrate 1. The plurality of wires 2 are selected from the following materials: indium tin oxide (ITO), indium zinc oxide (IZO), and metals. The plurality of light-emitting areas include a light-emitting diode area 41 and a virtual area 42. The plurality of light-emitting areas 4 are arranged on the plurality of wires 2 in a matrix, which makes the cathode and the anode of the light-emitting diode of the light-emitting diode area 41 electrically connected to the plurality of wires 2 respectively and also makes the virtual area 42 or the light-emitting diode area 41 of the light-emitting areas 4 correspond to each other (Shown in FIG. 1). The plurality of light-emitting areas 4 are small molecular organic light guiding layers or large molecular organic light guiding layers covered on the light-emitting diode and the plurality of wires 2. The light-emitting diodes may be flip-chip (FIG. 2A to FIG. 2C) or vertical (FIG. 3A to FIG. 3C) micro light-emitting diodes. A driver IC 8 is formed on the virtual area 42 of the plurality of light-emitting areas 4 corresponding to each other (Shown in FIG. 1).

Through disposing the virtual area 42, the driver IC 8 is formed on the light-emitting areas 4. Moreover, in the manufacturing process, if the light-emitting diodes of the light-emitting diode area are damaged, a light-emitting diode 41 with normal function may be formed in the virtual area 42 to prevent dysfunction of the display panel due to few damaged light-emitting diodes.

Furthermore, the present disclosure provides a flow chart for production of the light-emitting diode display according to an embodiment (flip-chip micro light-emitting diode). Please refer to FIG. 2A which illustrates the following steps, step S1: providing a substrate 1, a glass substrate for example; step S2: forming a plurality of wires 2 on the substrate 1; step S3: forming a photosensitive resin black matrix 3 (Resin-BM, Black Matrix) on a substrate 1 and a plurality of wires 2, wherein the photosensitive resin black matrix 3 has a find shading property, high resolution, fine evenness, and fine heat resistance; step S4: forming a flip-chip micro light-emitting diode on the plurality of wires 2 in a light-emitting diode area 41, wherein the anode and cathode of the flip-chip micro light-emitting diode are electrically connected to the plurality of wires 2 respectively; and step S5: forming a light-emitting area 4 (for example, transparent small molecule molecular organic light guiding layers or large molecular organic light guiding layers) on the plurality of wires 2 and the flip-chip micro light-emitting diode, wherein the photosensitive resin black matrix 3 separates the plurality of light-emitting areas 4 from each other, thus preventing the illumination in one light-emitting area 4 from affecting that in another light-emitting area 4.

Next, please refer to FIG. 2B which illustrates the following steps, step S6: forming a contact hole in the photosensitive resin black matrix 3; step S7: forming a first metal layer 5 on the photosensitive resin black matrix 3, the plurality of light-emitting areas 4, and the contact hole, which makes the first metal layer 5 electrically connected to the plurality of wires 2, wherein the first metal layer 5 may be selected from any of the following materials: molybdenum (Mo), titanium (Ti), tungsten (W), aluminum (Al), copper (Cu), and the composite metal material thereof; step S8: forming a flat layer 6 on the photosensitive resin black matrix 3 and the first metal layer 5, wherein the flat layer 6 is a transparent organic material; and step S9: forming a contact hole on the flat layer 6 and the photosensitive resin black matrix 3.

Next, please refer to FIG. 2C which illustrates the following steps, step S10: forming a second metal layer 7 on the flat layer 6 and the contact hole in the photosensitive resin black matrix 3, wherein the second metal 7 is electrically connected to the plurality of wires 2 and the first metal layer 5, and the second metal 7 may be selected from any of the following materials: molybdenum (Mo), titanium (Ti), tungsten (W), aluminum (Al), copper (Cu), and the composite metal material thereof; step S11: forming a driver IC 8 on the second metal layer 7 which corresponds to the photosensitive resin black matrix 3 and the virtual area 42 (Shown in FIG. 1), which makes the driver IC 8 electrically connect to the anode and cathode of the flip-chip micro light-emitting diode to control the flip-chip micro light-emitting diode; and step S12: further forming a protective layer 9 on the second metal layer 7, the flat layer 6, and the driver IC 8 to protect the inner elements from pollution, moisture, and light.

In addition, the present disclosure provides the flow chart for production of the light-emitting diode display according to another embodiment (a vertical micro light-emitting diode). Please Refer to FIG. 3A which illustrates the following steps, step S1-1: providing a substrate, a glass substrate for example; step S2-1: forming a plurality of wires 2 on the substrate 1; step S3-1: forming a photosensitive resin black matrix 3 (Resin-BM, Black Matrix) on the substrate 1 and the plurality of wires 2, wherein the photosensitive resin black matrix 3 has find shading property, high resolution, fine evenness, and fine heat resistance; step S4-1: forming a vertical micro light-emitting diode on the plurality of wires 2 of the light-emitting diode area 41, wherein the anode or the cathode of the vertical micro light-emitting diode is electrically connected to the plurality of wires 2 respectively; step S5-1: forming a light-emitting area 4 (for example, transparent small molecule molecular organic light guiding layers or large molecular organic light guiding layers) on the plurality of wires 2 and the vertical micro light-emitting diode, wherein the photosensitive resin black matrix 3 separates the plurality of light-emitting areas 4 from each other, thus preventing the illumination in one light-emitting area 4 from affecting that in another light-emitting area 4.

Figure 3B:
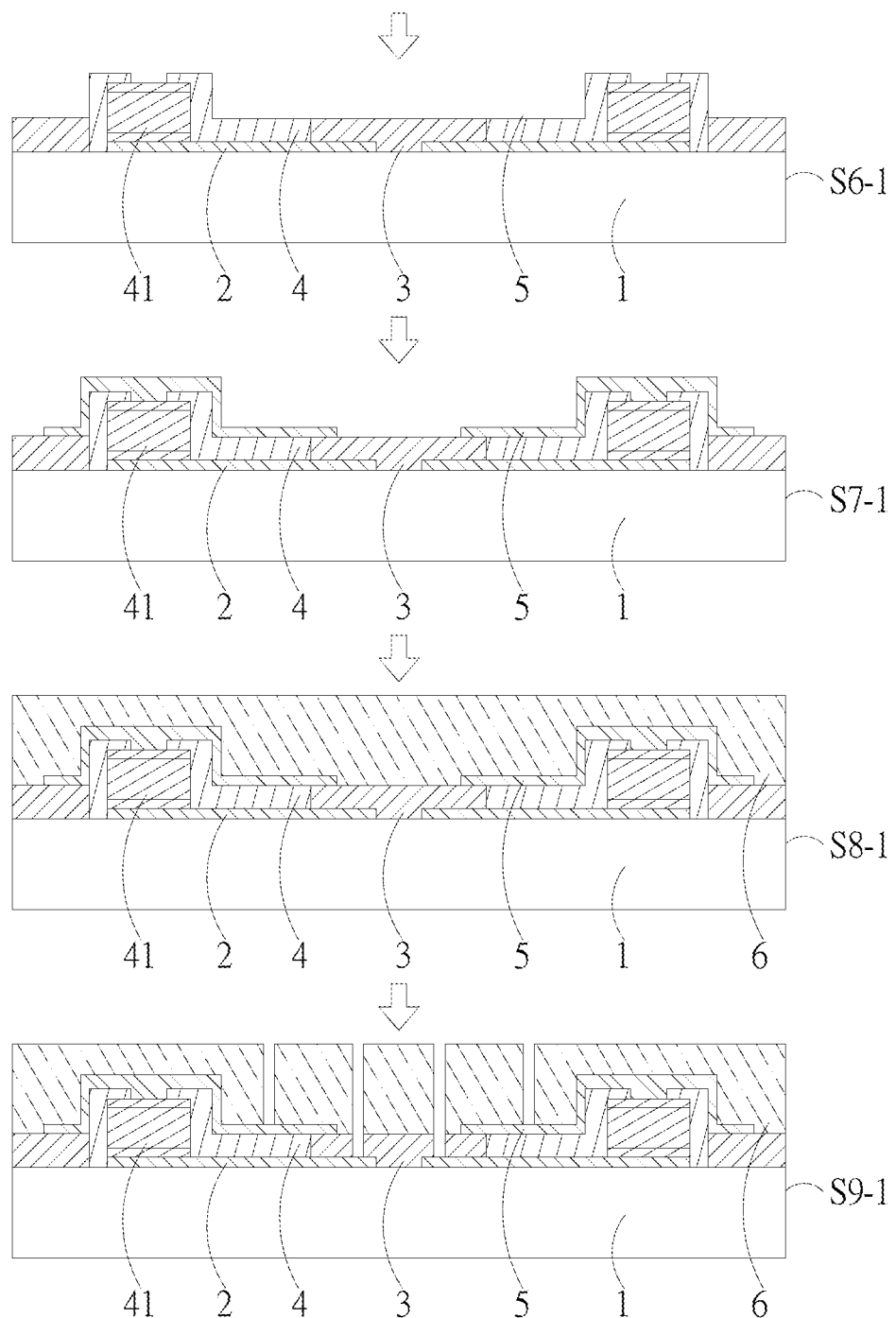
FIG. 3B depicts a flow chart for production of the light-emitting diode display according to another embodiment (vertical micro light-emitting diode) of the present disclosure.

Next, please refer to FIG. 3B which illustrates the following steps, step S6-1: forming a contact hole in the light-emitting areas 4; step S7-1: forming a first metal layer 5 on the photosensitive resin black matrix 3, the plurality of light-emitting areas 4, and a contact hole, which makes the first metal layer 5 electrically connected to the anode or the cathode of the vertical micro light-emitting diode, wherein the first metal layer 5 may be selected from any of the following materials: molybdenum (Mo), titanium (Ti), tungsten (W), aluminum (Al), copper (Cu), and the composite metal material thereof; Step S8-1: forming a flat layer 6 on the photosensitive resin black matrix 3 and the first metal layer 5, wherein the flat layer 6 is a transparent organic material; and step S9-1: forming a contact hole on the flat layer 6 and the photosensitive resin black matrix 3.

Figure 3C:
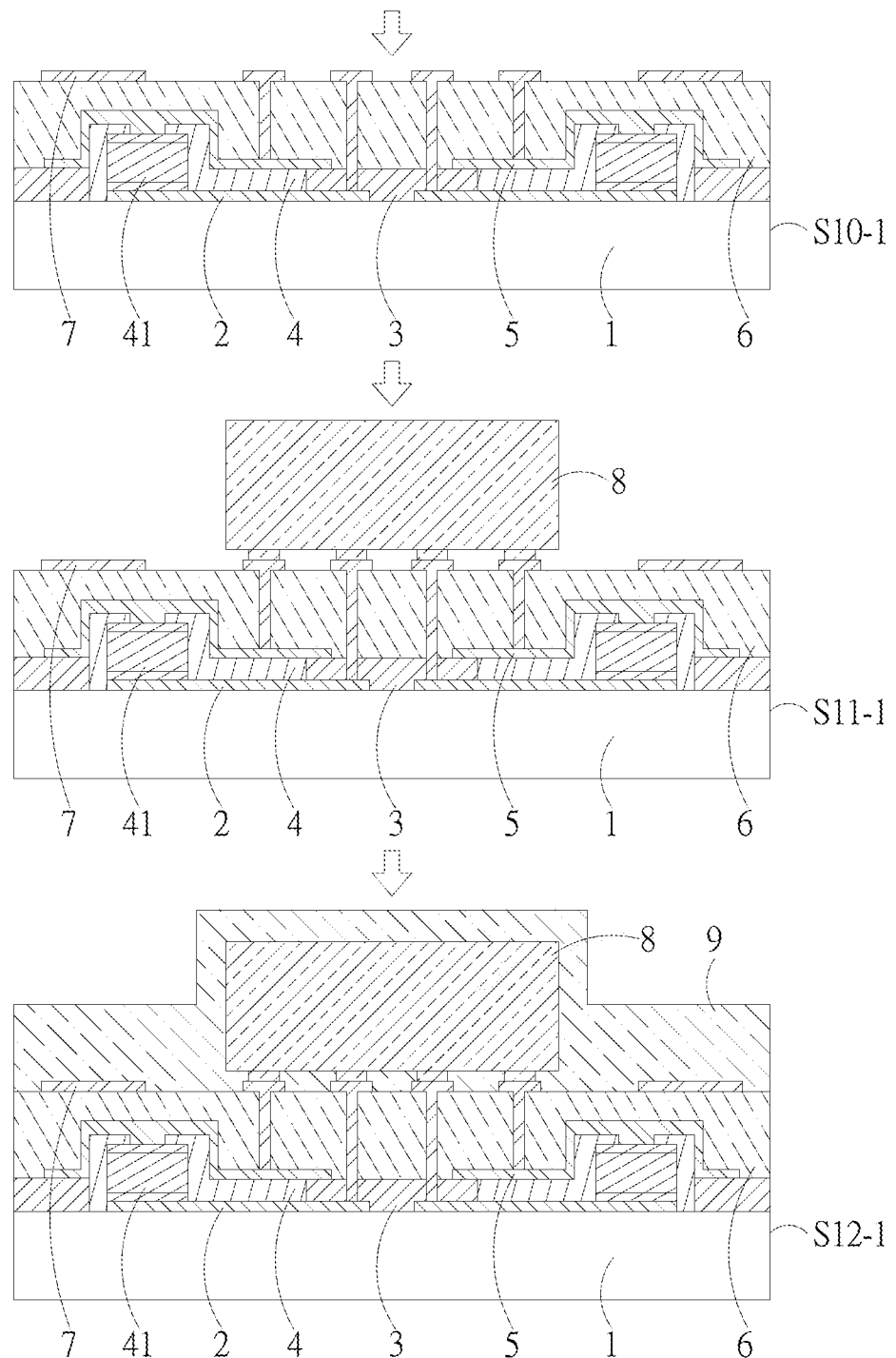
FIG. 3C depicts a flow chart for production of the light-emitting diode display according to another embodiment (vertical micro light-emitting diode) of the present disclosure.

Next, please refer to FIG. 3C which illustrates the following steps, step S10-1: forming the second metal layer 7 on the flat layer 6 and the contact hole of the photosensitive resin black matrix 3, wherein the second metal 7 is electrically connected to the plurality of wires 2 and the first metal layer 5, and the second metal 7 may be selected from any of the following materials: molybdenum (Mo), titanium (Ti), tungsten (W), aluminum (Al), copper (Cu), and the composite metal material thereof; step S11-1: forming a driver IC 8 on the second metal layer 7 which corresponds to the photosensitive resin black matrix 3 and the virtual area 42 (shown in FIG. 1), which makes the driver IC 8 electrically connect to the anode and cathode of the flip-chip micro light-emitting diode to control the vertical micro light-emitting diode; and step S12-1: further forming a protective layer 9 on the second metal layer 7, the flat layer 6, and the driver IC 8 to protect the inner elements from pollution, moisture and light.

In addition, the plurality of wires 2 on the substrate 1, the first metal layer 5, and the second metal layer 7 in the present disclosure may increase thicknesses by an electroplating process so as to reduce impedance depending on actual requirements for products.

Furthermore, the aforementioned process may generate unexpected high voltage static electricity to the floating metal that is not electrically connected and cause damage to the product. Accordingly, the present disclosure provides the following methods for circuit protection:

1. Please Refer to FIG. 4A. Specifically, the first metal layer 5 in the present disclosure includes a plurality of metal wires. The plurality of metal wires are electrically connected to each other through a shorting bar 51. In this way, equal potential may be maintained between the plurality of metal wires of the first metal layer 5. Similarly, the plurality of wires 2 may be divided into groups and electrically be connected to each other by shorting bars 23, 24, and 25 to maintain the potential of each of the metal wire groups. Afterward, as long as what is between the shorting bars 51, 23, 24, and 25 does not exist large potential difference, damages by the high voltage static electricity between the vertical and horizontal plurality of metal wires of the first metal layer 5 and the plurality of wires 2 may effectively be prevented. After the manufacturing process, all the metal wires may turn back to the original state and function independently by just removing the shorting bars 51, 23, 24, and 25.

2. Please refer to FIG. 4B. The plurality of wires 2 in the present disclosure are electrically connected to each other by the impedance line 2. The impedance line 21 generates a high-impedance effect by the elongated structure. This may ensure that once a pressure difference is instantaneously generated between the wires 2, the pressure difference may be eliminated through the impedance line 21 without affecting the independent operation of each of the wires 2 due to the presence of the impedance line 21. Accordingly, the effectiveness for electrostatic protection may be provided for the plurality of wires 2.

3. Please refer to FIG. 4C. A plurality of spiky metal blocks 22 are disposed beside the plurality of wires 2. By using the principle of tip discharge, the sharper the metal tip is, the more likely to induce a discharge effect due to the stronger electric field, which can effectively consume the static charge accumulated on the metal wire 2, thereby reducing the damage caused by high voltage static electricity. In addition, the distance between the plurality of tip metal blocks 22 and the plurality of wires 2 may also be used to adjust the condition of the occurrence of the tip discharge effect. The closer the distance is, the more likely the tip discharge effect will occur. With this feature, the designer may adjust the timing and the conditions of the tip discharge effect, thereby improving the effectiveness for electrostatic protection.

In summary, the present disclosure enables the driver IC to correspondingly form on the light-emitting areas by disposing the virtual area. Next, with the improvement of the materials and the soldering technique, the driver IC may be disposed on the flat layer and the photosensitive resin black matrix. In addition, because the driver IC is able to correspondingly be formed on the virtual area and the photosensitive resin black matrix, the plurality of light-emitting areas may be close to each other more tightly, thus shortening the distance between the pixels. Furthermore, by disposing the photosensitive resin black matrix between the plurality of light-emitting areas, the illumination in one light-emitting area affecting that in another light-emitting area may be prevented. Moreover, a protective layer may further be formed on the second metal layer, the flat layer, and the driver IC to protect the inner elements from pollution, moisture, and light. Lastly, when a light-emitting diode of the light-emitting diode area is damaged, a light-emitting diode with normal function may be formed in the virtual area 42 to prevent dysfunction of the display panel due to the damage of few light-emitting diodes.

The above mentioned is illustrative only and not restrictive. Any equivalent modifications or changes made to the spirit and scope of the present disclosure should be included in the extent of the patent application.

What is claimed is:

1. A light-emitting diode display, comprising:
   a substrate;
   a plurality of wires formed on the substrate;
   a plurality of light-emitting areas each comprising a light-emitting diode area, a virtual area and a light guiding layer, wherein the plurality of light-emitting areas are arranged on the plurality of wires, and the plurality of light-emitting areas are arranged in a form of a matrix with columns and rows; and
   a driver IC formed on the plurality of light-emitting areas to overlap the virtual areas;
   wherein a damaged light-emitting diode is disposed in the light-emitting diode area of one of the plurality of light-emitting areas, and a functioning light-emitting diode is disposed in the virtual area of the one of the plurality of light-emitting areas.

2. The light-emitting diode display according to claim 1, wherein the light guiding layer is a small molecular organic light guiding layer or a large molecular organic light guiding layer.

3. The light-emitting diode display according to claim 1, wherein a photosensitive resin black matrix is formed between the plurality of light-emitting areas.

4. The light-emitting diode display according to claim 3, wherein a first metal layer is formed on the plurality of light-emitting areas, and a flat layer is formed on the first metal layer.

5. The light-emitting diode display according to claim 4, wherein a second metal layer is formed on the flat layer, and the driver IC is formed on the second metal layer to overlap the photosensitive resin black matrix and the virtual area.

6. The light-emitting diode display according to claim 5, further comprising a protective layer formed on the second metal layer, the flat layer, and the driver IC.

7. The light-emitting diode display according to claim 6, wherein the protective layer is made of an opaque organic material.

8. The light-emitting diode display according to claim 6, wherein the flat layer is made of a transparent organic material.

9. The light-emitting diode display according to claim 1, wherein the light-emitting diode area comprises a plurality of micro light-emitting diodes.

10. The light-emitting diode display according to claim 9, wherein the plurality of micro light-emitting diodes are flip-chip types or vertical types.

11. The light-emitting diode display according to claim 5, wherein the plurality of wires, the first metal layer, and the second metal layer increase thicknesses by an electroplating process, thus reducing impedance.

12. The light-emitting diode display according to claim 5, wherein the first metal layer comprises a plurality of metal wires, and the plurality of wires are electrically connected to each other through a shorting bar.

13. The light-emitting diode display according to claim 5, wherein the plurality of wires are electrically connected to each other through an impedance line.

14. The light-emitting diode display according to claim 5, wherein a plurality of spiky metal blocks are disposed beside the plurality of wires.

15. A light-emitting diode display, comprising:
   a substrate;
   a plurality of wires formed on a top of the substrate;
   a plurality of light-emitting areas each comprising a light-emitting diode area, a virtual area and a light guiding layer, wherein the plurality of light-emitting areas are arranged on the plurality of wires, and the plurality of light-emitting areas are arranged in a form of a matrix with columns and rows; and
   a driver IC formed on the plurality of light-emitting areas to overlap the virtual areas;
   wherein a damaged light-emitting diode is disposed in the light-emitting diode area of one of the plurality of light-emitting areas, and a functioning light-emitting diode is disposed in the virtual area of the one of the plurality of light-emitting areas.

16. A method for producing a light-emitting diode display, comprising:
   providing a substrate;
   forming a plurality of wires on the substrate;
   arranging a plurality of light-emitting areas on the plurality of wires and arranging the plurality of light-emitting areas in a form of a matrix with columns and rows, wherein each of the plurality of light-emitting areas comprises a light-emitting diode area, a virtual area and a light guiding layer; and
   disposing a driver IC on the plurality of light-emitting areas to overlap the virtual areas;
   wherein when a damaged light-emitting diode is disposed in the light-emitting diode area of one of the plurality of light-emitting areas, a functioning light-emitting diode is disposed in the virtual area of the one of the plurality of light-emitting areas.

17. The method according to claim 16, wherein the light guiding layer is a small molecular organic light guiding layer or a large molecular organic light guiding layer.

18. The method according to claim 16, further comprising forming a photosensitive resin black matrix between the plurality of light-emitting areas.

19. The method according to claim 18, further comprising forming a first metal layer on the plurality of light-emitting areas, and forming a flat layer on the first metal layer.

20. The method according to claim 19, further comprising forming a second metal layer on the flat layer, and disposing the driver IC on the second metal layer to overlap the photosensitive resin black matrix and the virtual area.

21. The method according to claim 20 further comprising forming a protective layer on the second metal layer, the flat layer, and the driver IC.

22. The method according to claim 21, wherein the protective layer is made of an opaque organic material.

23. The method according to claim 21, wherein the protective layer is made of a transparent organic material.

24. The method according to claim 16, wherein the light-emitting diode area comprises a plurality of micro light-emitting diodes.

25. The method according to claim 23, wherein the plurality of micro light-emitting diodes are flip-chip types or vertical types.

26. The method according to claim 20, wherein the plurality of wires, the first metal layer, and the second metal layer increase thicknesses by an electroplating process, thus reducing the impedance.

27. The method according to claim 20, wherein the first metal layer comprises a plurality of wires, and the plurality of wires are electrically connected to each other through a shorting bar.

28. The method according to claim 20, wherein the plurality of wires are electrically connected to each other through an impedance line.

29. The method according to claim 20, further comprising disposing a plurality of spiky metal blocks beside the plurality of wires.

30. A method for producing a light-emitting diode display, comprising:

providing a substrate;

forming a plurality of wires on a top of the substrate;

arranging a plurality of light-emitting areas on the plurality of wires and arranging the plurality of light-emitting areas in a form of a matrix with columns and rows, wherein each of the plurality of light-emitting areas comprises a light-emitting diode area, a virtual area and a light guiding layer; and disposing a driver IC on the plurality of light-emitting areas to overlap the virtual areas;

wherein when a damaged light-emitting diode is disposed in the light-emitting diode area of one of the plurality of light-emitting areas, a functioning light-emitting diode is disposed in the virtual area of the one of the plurality of light-emitting areas.

* * * * *